(12) United States Patent
Oneill

(10) Patent No.: US 11,169,306 B1
(45) Date of Patent: Nov. 9, 2021

(54) CURVILINEAR PRISMATIC FILM WHICH ELIMINATES GLARE AND REDUCES FRONT-SURFACE REFLECTIONS FOR SOLAR PANELS AND OTHER SURFACES

(71) Applicant: Mark Joseph Oneill, Keller, TX (US)

(72) Inventor: Mark Joseph Oneill, Keller, TX (US)

(*) Notice: Subject to any disclaimer, the term of this patent is extended or adjusted under 35 U.S.C. 154(b) by 0 days.

(21) Appl. No.: 17/225,849

(22) Filed: Apr. 8, 2021

(51) Int. Cl.
*G02B 1/11* (2015.01)
*G02B 5/04* (2006.01)
*H01L 31/0216* (2014.01)

(52) U.S. Cl.
CPC ............. *G02B 5/045* (2013.01); *G02B 1/11* (2013.01); *H01L 31/02168* (2013.01)

(58) Field of Classification Search
CPC ...... G02B 5/045; G02B 1/11; H01L 31/02168
See application file for complete search history.

(56) References Cited

U.S. PATENT DOCUMENTS

| | | | | |
|---|---|---|---|---|
| 4,120,565 A | * | 10/1978 | Rabi | G02B 5/045 359/836 |
| 4,799,137 A | * | 1/1989 | Aho | F21S 43/40 362/309 |
| 4,874,228 A | * | 10/1989 | Aho | G02B 6/0026 349/62 |
| 6,354,709 B1 | * | 3/2002 | Campbell | G02B 5/045 359/837 |
| 6,540,382 B1 | * | 4/2003 | Simon | G02B 5/045 362/339 |
| 2002/0057564 A1 | * | 5/2002 | Campbell | G02B 6/0065 362/627 |
| 2004/0080948 A1 | * | 4/2004 | Subisak | F21V 3/00 362/327 |
| 2005/0141243 A1 | * | 6/2005 | Mullen | B29D 11/00 362/600 |
| 2005/0237641 A1 | * | 10/2005 | Tang | G02B 6/0053 359/831 |
| 2007/0115569 A1 | * | 5/2007 | Tang | G02B 6/0053 359/831 |
| 2007/0121227 A1 | * | 5/2007 | Wang | G02B 5/0242 359/831 |
| 2009/0135490 A1 | * | 5/2009 | Lee | G02B 5/0242 359/599 |
| 2011/0032727 A1 | * | 2/2011 | Kinder | G02B 6/0055 362/606 |
| 2013/0182331 A1 | * | 7/2013 | Hebrink | B82Y 30/00 359/601 |
| 2013/0186466 A1 | * | 7/2013 | Hebrink | B82Y 30/00 136/256 |

(Continued)

*Primary Examiner* — Balram T Parbadia

(57) ABSTRACT

This invention is a novel transparent curvilinear prismatic film which eliminates glare and reduces front-surface reflections when applied to solar panels and other surfaces with a transparent adhesive. The new prismatic film comprises an exposed top surface with substantially triangular prisms following a curvilinear path across the top surface and a bottom surface which is substantially flat and smooth. The bottom surface is configured to enable a transparent adhesive bond to the solar panel or other surface beneath the prismatic film to eliminate glare and to reduce front-surface reflections from this solar panel or other surface. The curvilinear prismatic film is configured to be transparent, thin, lightweight, and inexpensive.

20 Claims, 12 Drawing Sheets

(56) References Cited

U.S. PATENT DOCUMENTS

| | | | |
|---|---|---|---|
| 2014/0198390 A1* | 7/2014 | Padiyath | G02B 5/04 359/591 |
| 2014/0211331 A1* | 7/2014 | Padiyath | E06B 9/24 359/837 |
| 2015/0337593 A1* | 11/2015 | Pricone | E06B 9/42 160/238 |
| 2017/0045189 A1* | 2/2017 | Pricone | G02B 19/0019 |
| 2017/0104121 A1* | 4/2017 | O'Neill | H01L 31/048 |
| 2017/0248743 A1* | 8/2017 | Hao | G02B 5/0231 |
| 2017/0291392 A1* | 10/2017 | Kawai | B32B 5/16 |
| 2018/0099307 A1* | 4/2018 | Takeda | B05D 1/04 |
| 2019/0235304 A1* | 8/2019 | Tamada | G02F 1/133502 |
| 2021/0116627 A1* | 4/2021 | Tsuji | G02B 6/0055 |

* cited by examiner

Net Transmittance into Curvilinear Prisms Following Cosine Arc Paths with ± 30° Maximum Slopes

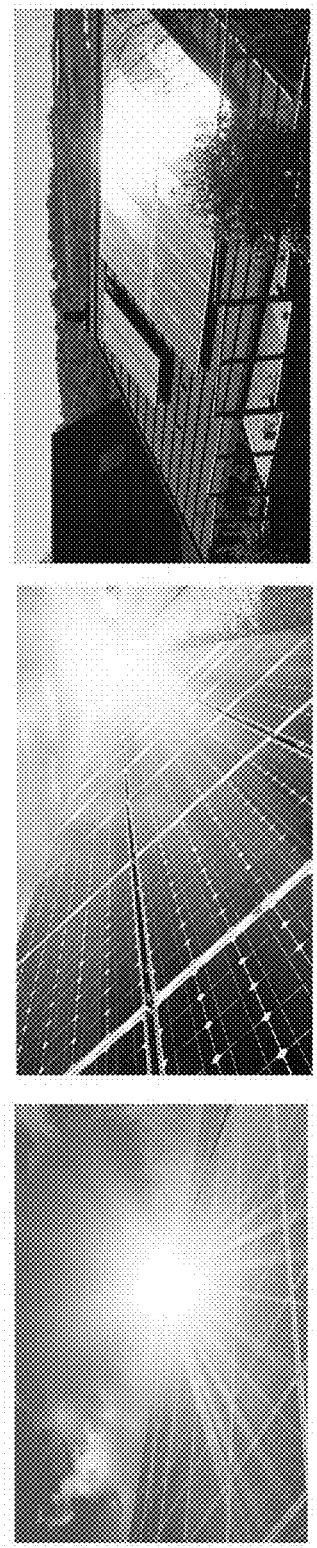
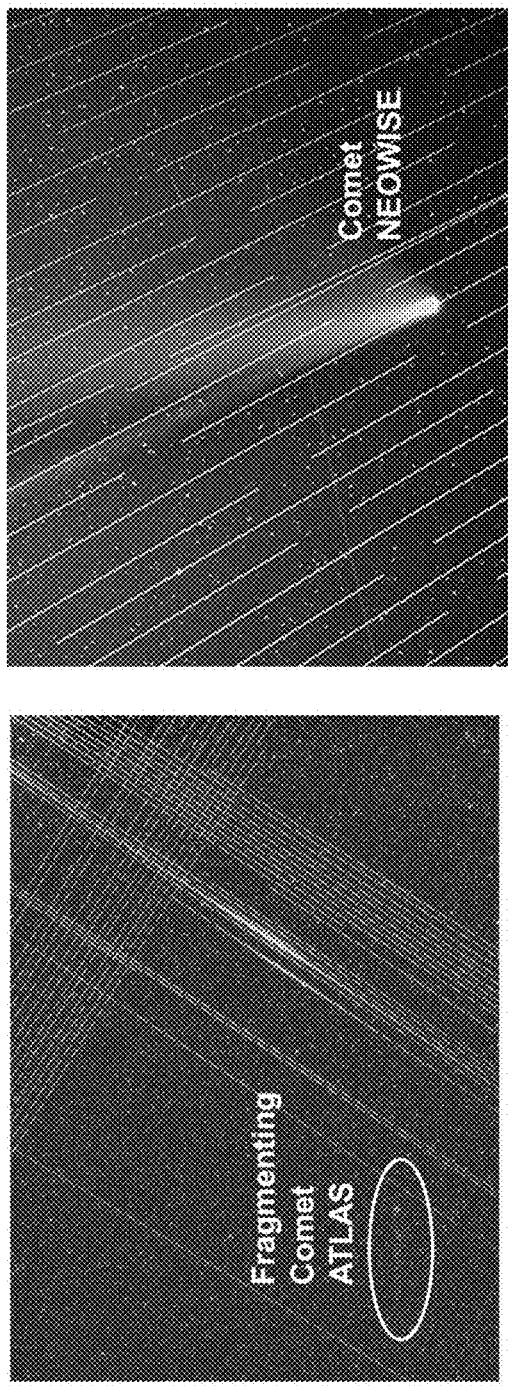
Fig. 11
Fig. 11-A: Terrestrial Solar Collectors Cause Glare Problems (Especially Near Roadways and Airports)
Fig. 11-B: Constellations of Low Earth Orbit Satellites Are Causing Glare Problems for Astronomy (Starlink Streaks Shown Above)

Fig. 12
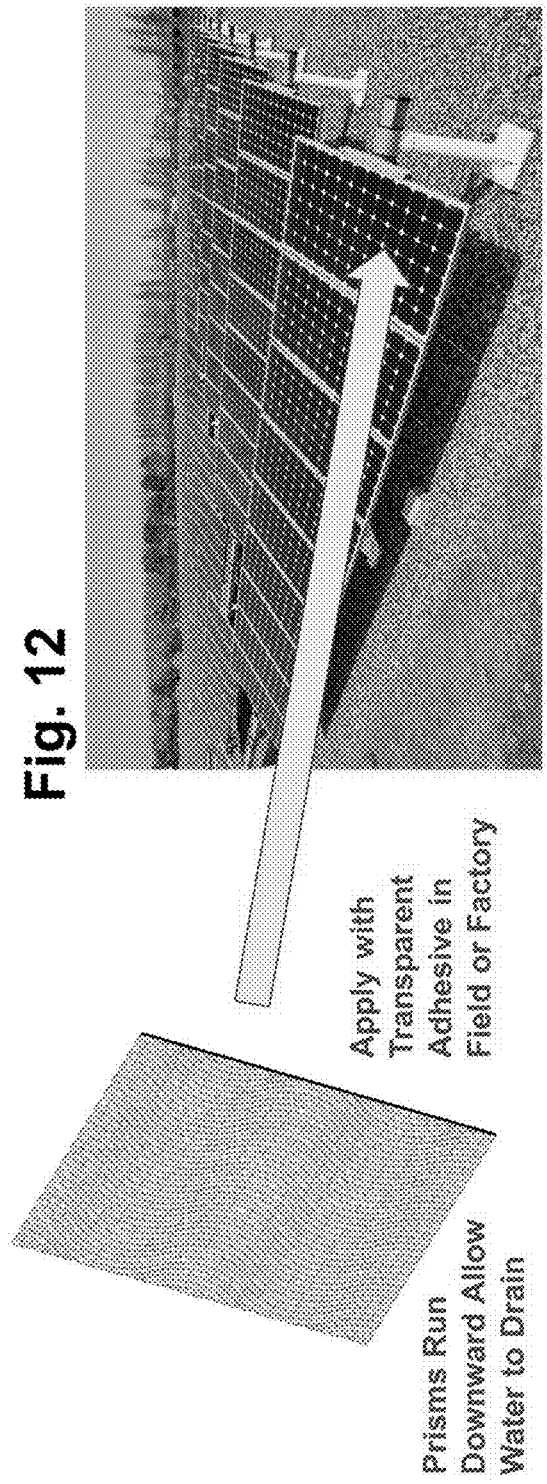
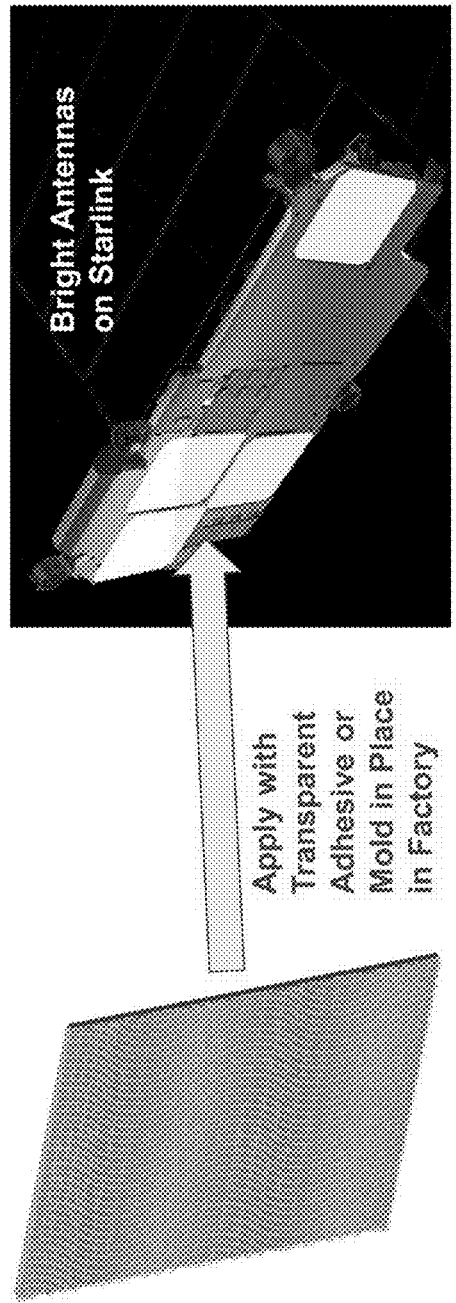
Fig. 12-A: Preferred Application of Invention to Glass Front Surface of Terrestrial Solar Collectors
Fig. 12-B: Preferred Application of Invention to Reflective Spacecraft Surfaces

CURVILINEAR PRISMATIC FILM WHICH ELIMINATES GLARE AND REDUCES FRONT-SURFACE REFLECTIONS FOR SOLAR PANELS AND OTHER SURFACES

CROSS REFERENCE TO RELATED APPLICATIONS

A provisional patent application was previously filed with the U.S. Patent and Trademark Office by the inventor disclosing key elements of the present invention. Application No. 63/064,499, entitled "Curvilinear Prismatic Film Which Eliminates Glare and Reduces Front-Surface Reflections for Solar Collectors and Other Surfaces," was filed Aug. 12, 2020. The inventor claims the filing date of this provisional application for the key elements disclosed in this provisional application.

BACKGROUND OF THE INVENTION

This invention is a novel transparent curvilinear prismatic film which eliminates glare and reduces front-surface reflections when applied to solar panels and other surfaces with a transparent adhesive. The new prismatic film comprises an exposed top surface with substantially triangular prisms following a curvilinear path across the top surface and a bottom surface which is substantially flat and smooth. The bottom surface is configured to enable a transparent adhesive bond to the solar panel or other surface beneath the prismatic film to eliminate glare from this solar panel or other surface. The curvilinear prismatic film is configured to be transparent, thin, lightweight, and inexpensive.

The new prismatic film achieves mitigation of glare by using curvilinear prisms. The curvature of such prisms scatters the light reflected from such prisms in a variety of azimuthal directions, thereby preventing glare which is due to reflection from flat surfaces oriented in the same direction. The triangular prism shape minimizes front-surface reflection losses by reducing the incidence angle of incident rays and by redirecting front-surface reflected rays into the adjacent prism rather than outward.

In this patent application, a solar panel is defined as an assembly of electrically interconnected photovoltaic cells integrated into a common structure. For space applications, such cells are generally multi junction photovoltaic devices which are typically covered on their exposed surface with individual thin ceria-doped glass windows, one per cell. For ground applications, such cells are generally single-junction silicon photovoltaic devices which are typically covered with one large glass window per panel. For space applications, the present invention will typically replace all of the individual cell glass windows with one curvilinear prismatic window attached with a transparent adhesive over the full panel area. For ground applications, the present invention will typically be attached with a transparent adhesive to the conventional glass window over the full panel area. In the above-referenced provisional patent application, the inventor used the term "solar collector" rather than "solar panel" but the intended meaning is the same. Solar panel seems to be the more widely accepted term.

When applied to a solar panel, the new curvilinear prismatic sheet reduces the reflection loss from the exposed surface of the glass window which is typically the outermost surface of most solar panels. The reflection loss is reduced by the present invention for all incidence angles of sunlight, thereby leading to greater collection of solar energy by the panel and a correspondingly greater electrical power output by the panel. Therefore, the value of the solar panel is enhanced. This enhancement is greatest for non-sun-tracking solar panels which experience the largest variation in incidence angles for solar rays through the day and through the year. The enhancement is greater for larger solar incidence angles.

The reduction in glare is important for ground-based solar arrays which are being deployed in increasing numbers around the world. The glare problem is severe when such arrays are near roadways or airports or occupied buildings. The present invention may be applied in the field to resolve the glare problem after the solar array has been installed, or in the factory to preclude the glare problem after installation.

In space applications, the present invention can not only be used for solar panels but also for other surfaces on spacecraft, to eliminate glare and to minimize front-surface reflection losses. When applied to a solar panel in space, the reduction in reflection losses leads to greater energy collection and greater value for the solar panel, while also saving weight and cost compared to the individual cell glass covers typically used. The reduction in glare is also important, especially for spacecraft in low-earth orbit such as the constellation of thousands of Starlink® spacecraft now being deployed by Space X to provide global internet coverage. The glare from such spacecraft is causing huge problems for earth-based telescopes, as widely reported in news articles over the past two years. If the glare is from surfaces other than solar panels, the present invention can be applied to such surfaces to minimize glare.

For ground-based applications, the new curvilinear prismatic film can be produced by low-cost, roll-to-roll embossing of thermally softened thermoplastic material such as acrylic, polycarbonate, thermoplastic polyurethane, or thermoplastic fluoropolymer such as ETFE or ECTFE. This process is well known for making prismatic road sign sheeting and similar products.

For ground-based applications, the curvilinear prisms are configured to allow rainwater or wash water to run downward and off the prismatic film, thereby minimizing dirt buildup on the exposed surfaces. For space-based applications, the curvilinear prisms are configured to allow cleaning liquids to run downward and off the prismatic film, thereby minimizing dirt retention on the exposed surfaces prior to launch into space.

For space-based applications, the new curvilinear prismatic film can be produced by casting a space-qualified silicone polymer against disposable molding tools made by low-cost, roll-to-roll embossing of thermoplastic material. This process has been previously developed and proven for making space Fresnel lenses by the inventor under NASA funding.

For curvilinear prisms with 45 degree tilt angles on both faces of each prism, the curvilinear prismatic film produced by low-cost, roll-to-roll embossing of thermoplastic material can be used directly as the prismatic window for terrestrial solar panels or used indirectly as the molding tool for the prismatic window for space solar panels, since both the embossed thermoplastic material and the material molded against the embossed thermoplastic material have essentially the same geometric configuration. This dual-use design is out preferred prism geometry.

In summary, the present invention solves the glare problem for solar panels and other surfaces both on the ground and in space. Furthermore, the present invention reduces front-surface reflections thereby enhancing the performance of solar panels on the ground and in space.

BRIEF SUMMARY OF THE INVENTION

This invention is a novel transparent curvilinear prismatic film which eliminates glare and minimizes front-surface reflections from solar panels or other surfaces to which the new film is bonded with a transparent adhesive.

The invention is a thin polymer film with triangular prisms on the exposed upper surface with such prisms following curvilinear paths. The bottom surface of the polymer film is smooth and flat to facilitate bonding to the underlying solar panel or other surface using a transparent adhesive.

The prismatic structure of the invention minimizes front-surface reflections and thereby enhances the performance and value of a solar panel to which it is applied. Such a solar panel may be on the ground or in space.

The curvilinear prismatic structure of the invention eliminates glare from the solar panel or other surface to which it is applied.

The curvilinear prismatic film of the present invention is configured for mass production by continuous roll-to-roll embossing of thermoplastic material, which may be used directly for ground-based applications or used as disposable molding tools for space-based applications. The invention solves major glare problems for both ground-based and space-based solar arrays and other surfaces.

Figure 1:
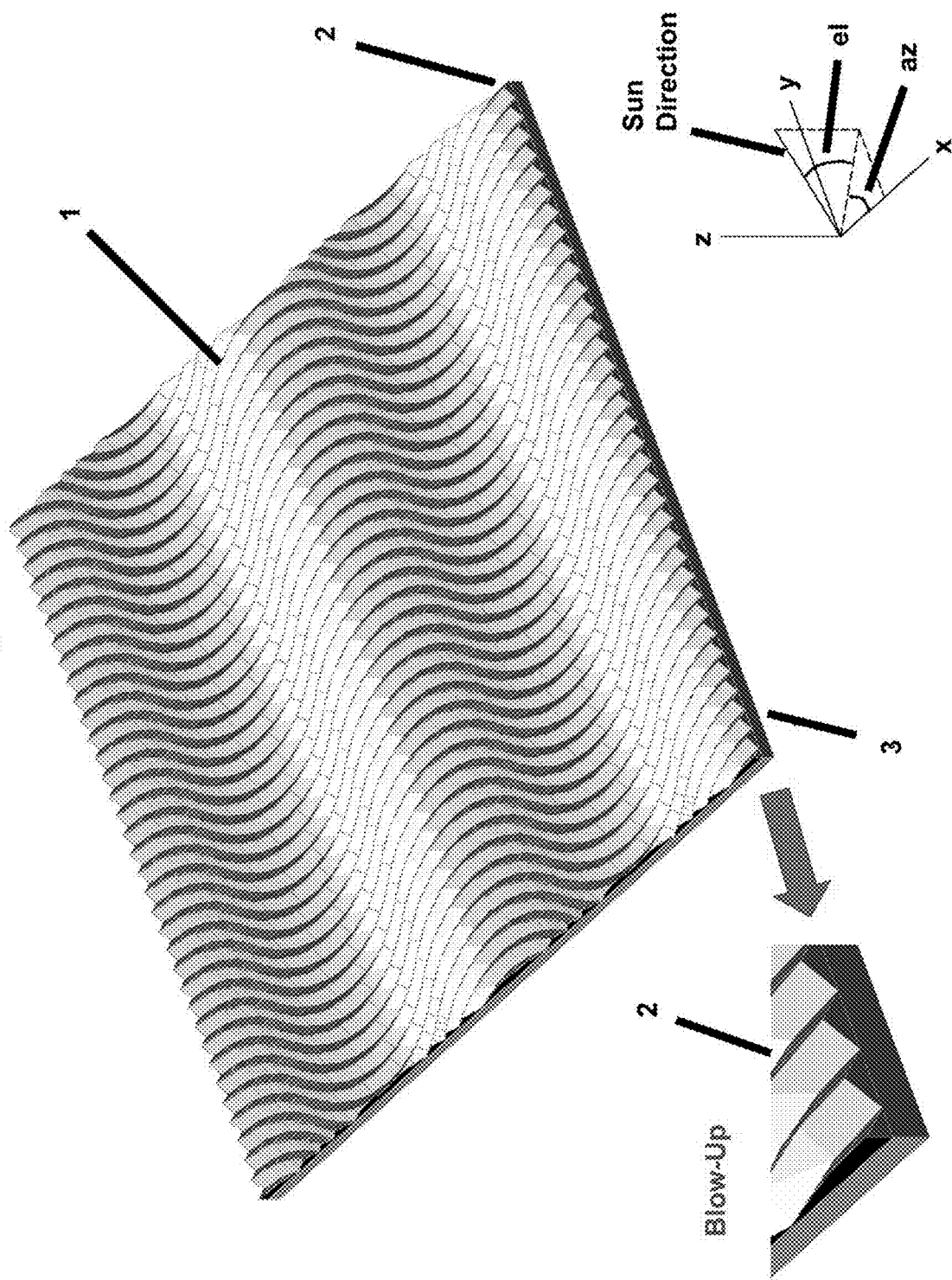
FIG. 1 shows an isometric view of the transparent curvilinear prismatic film which eliminates glare and minimizes front-surface reflection losses for surfaces to which it is bonded with a transparent adhesive. The top exposed surface of the film comprises a multitude of substantially triangular curvilinear prisms 1 which run across the exposed surface in curvilinear paths. The cross-sectional shape of these prisms 2 is triangular. The bottom surface 3 is flat and smooth to facilitate bonding to an underlying solar panel or other surface using a transparent adhesive. A blow-up of the triangular shape of the prisms 2 is shown in the lower left portion of FIG. 1. The definition of the principal axes (x, y, and z) and the solar elevation angle (el) and the solar azimuth angle (az) are also shown in the lower right portion of FIG. 1. The prismatic film is shown, for example purposes only, as rectangular in shape when viewed from above in FIG. 1. The film can be any shape to fit any surface to which it will be bonded. The prisms shown in FIG. 1 are greatly enlarged for clarity. In a real application, the prisms will be very small, about 100 micrometers wide. Similarly, the curvilinear shapes in FIG. 1 are greatly enlarged for clarity. In a real application, the curves will repeat in a lengthwise pattern over relatively short distances of a few centimeters.

There are an infinite number of possible curvilinear paths for the triangular prisms to follow with one principal path feature being a repeating curve in the x-direction of FIG. 1 with a curve slope [atan(dy/dx)] varying continuously from a zero value to a minimum non-zero negative value to another zero value to a maximum non-zero positive value to another zero value and so on. One common mathematical curve to have this feature is the cosine curve which works very well for the present invention and is currently preferred, although many other curves will also be acceptable. The inventor has analyzed various cosine curves for performance, as discussed in the following paragraphs.

Figure 5:
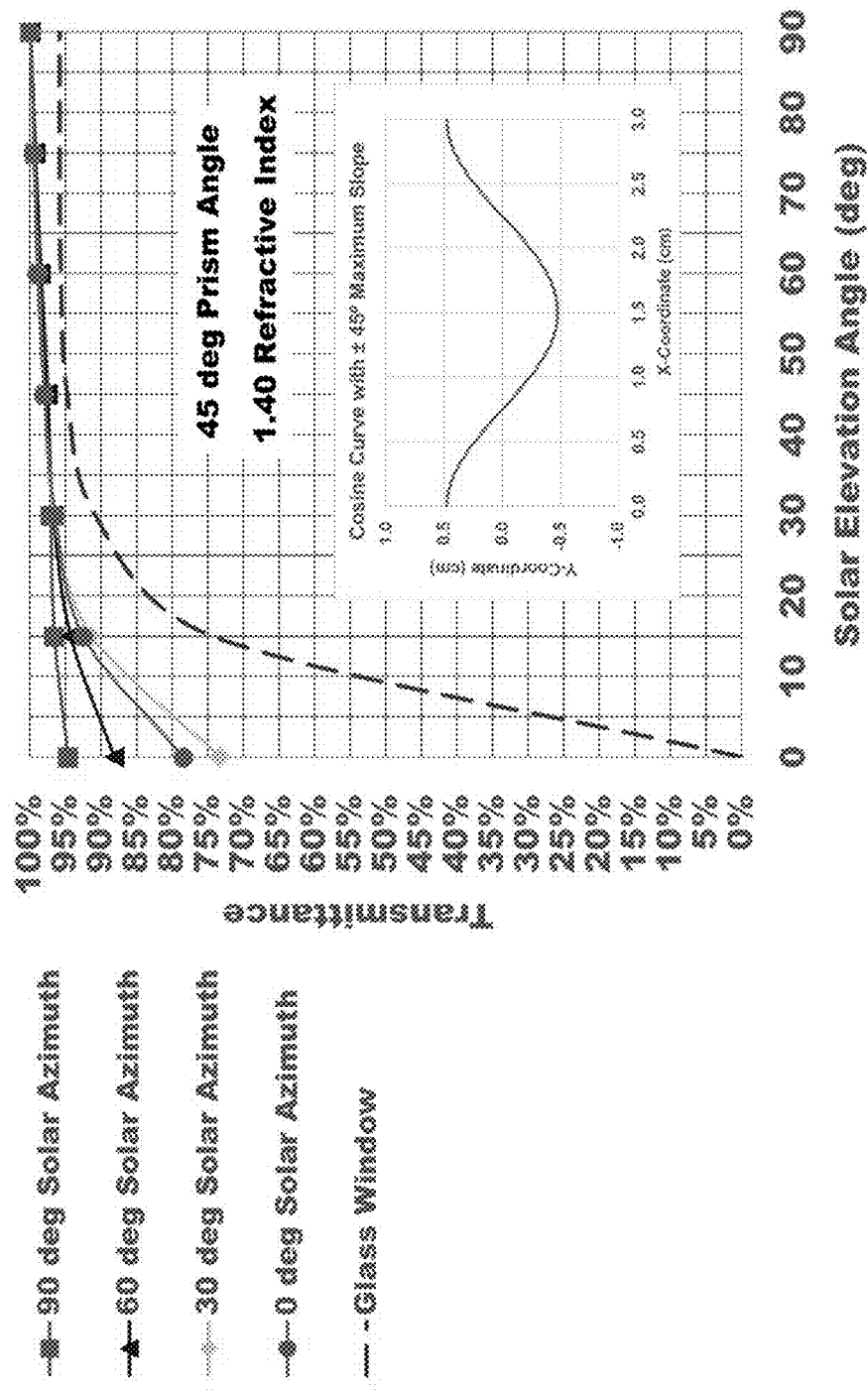

FIG. 5 shows results of a parametric ray trace analysis by the inventor for one version of the invention shown in FIG. 1. These results show the net transmittance into the prismatic film including the front-surface reflection capture for triangular prisms 2 with 45-degree angles for both the left and right sides of the triangle. The material is modeled with a refractive index of 1.40, which corresponds to silicone or ETFE. The curvilinear shape is shown in the inset of FIG. 5 and corresponds to a minimum/maximum slope of ±45 degrees. The top four curves in FIG. 5 correspond to different solar azimuth angles (az) as previously shown in FIG. 1. The bottom curve shows the results for a conventional flat glass window surface without any prisms. All curves are plotted versus solar elevation angle (el) as previously shown in FIG. 1. The transmittance improvement provided by the present invention is striking. For example, for grazing rays corresponding to a solar elevation angle of about 0 degrees, the flat window would have an essentially zero transmittance of incident light into the surface for all azimuth angles. In contrast, the curvilinear prismatic film would have a transmittance from 73% to 95% depending on solar azimuth angle. The benefit of the prismatic film is maintained for all solar elevation angles up to and including 90 degrees. At 90 degrees solar elevation, the gain is from about 96% to essentially 100%.

Figure 6:
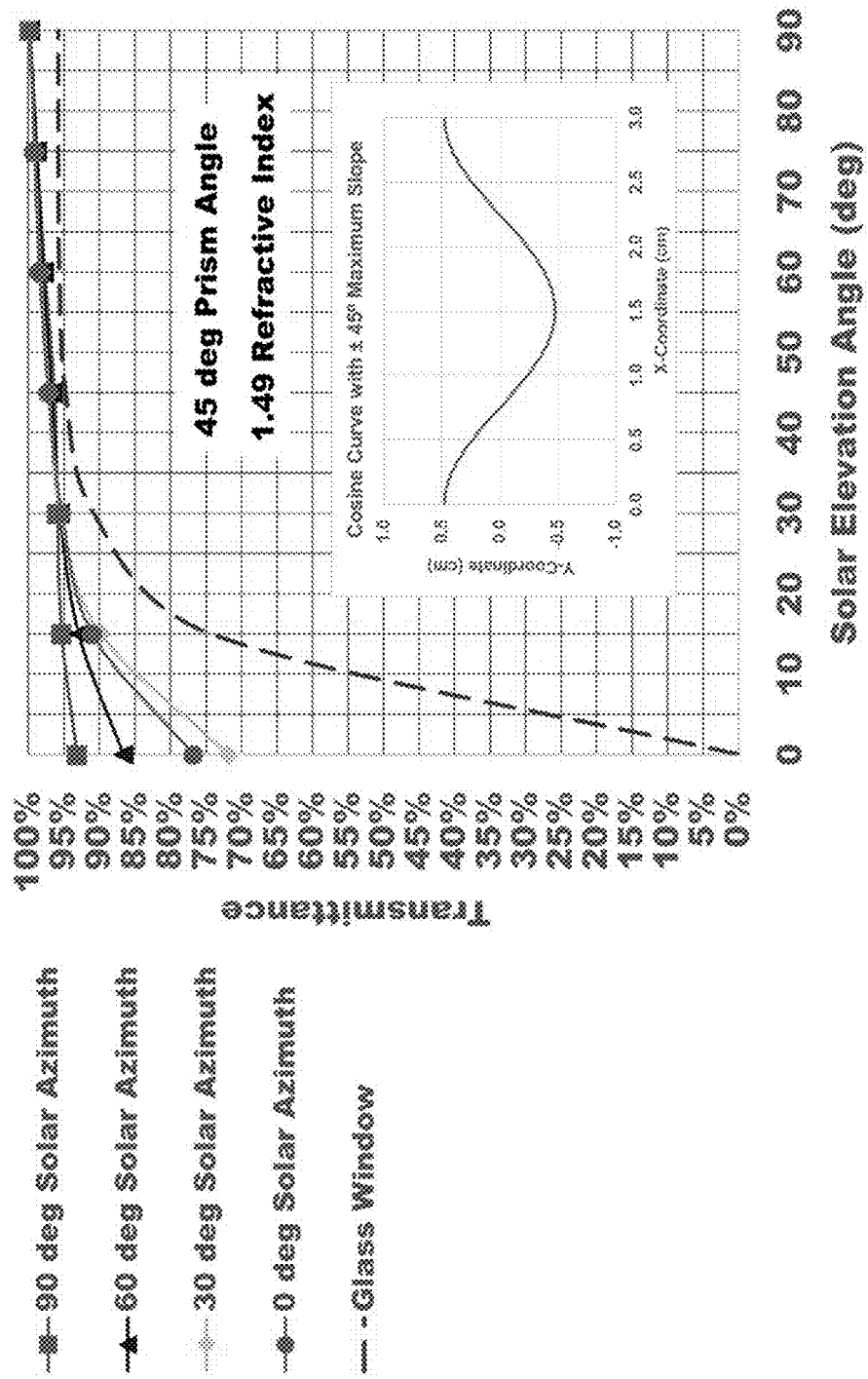

FIG. 6 shows results of a parametric ray trace analysis by the inventor for another version of the invention shown in FIG. 1. These results show the net transmittance into the prismatic film including the front-surface reflection capture for triangular prisms 2 with 45-degree angles for both the left and right sides of the triangle. The material is modeled with a refractive index of 1.49, which corresponds to acrylic or thermoplastic polyurethane. The curvilinear shape is shown in the inset of FIG. 6 and corresponds to a minimum/maximum slope of ±45 degrees. The top four curves in FIG. 6 correspond to different solar azimuth angles (az) as previously shown in FIG. 1. The bottom curve shows the results for a conventional flat glass window surface without any prisms. All curves are plotted versus solar elevation angle (el) as previously shown in FIG. 1. The transmittance improvement provided by the present invention is striking. For example, for grazing rays corresponding to a solar elevation angle of about 0 degrees, the flat window would have an essentially zero transmittance of incident light into the surface for all azimuth angles. In contrast, the curvilinear prismatic film would have a transmittance from 72% to 93% depending on solar azimuth angle. The benefit of the prismatic film is maintained for all solar elevation angles up to and including 90 degrees. At 90 degrees solar elevation, the gain is from about 96% to essentially 100%.

Figure 7:
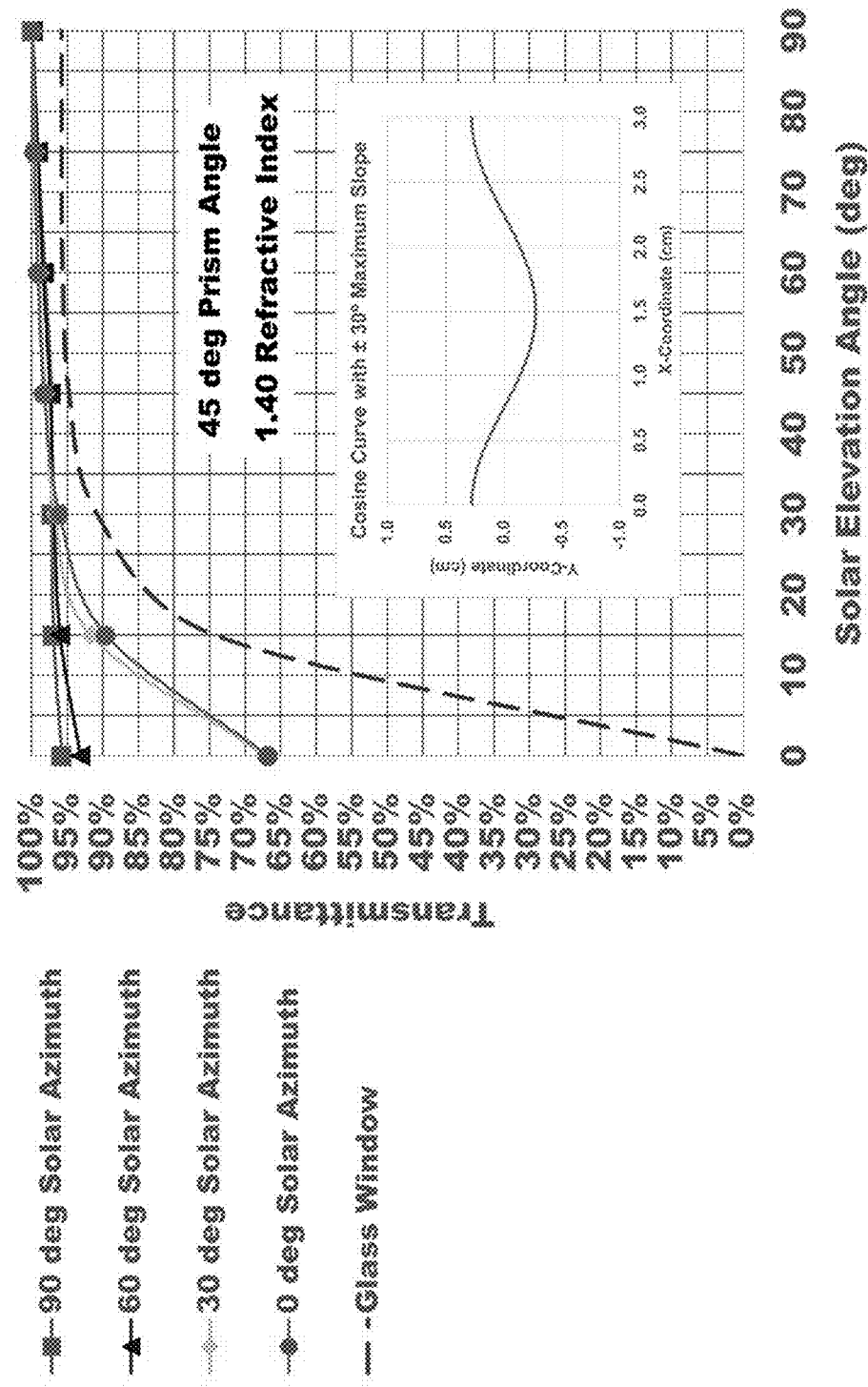

FIG. 7 shows results of a parametric ray trace analysis by the inventor for yet another version of the invention shown in FIG. 1. These results show the net transmittance into the prismatic film including the front-surface reflection capture for triangular prisms 2 with 45-degree angles for both the left and right sides of the triangle. The material is modeled with a refractive index of 1.40, which corresponds to silicone or ETFE. The curvilinear shape is shown in the inset of FIG. 7 and corresponds to a minimum/maximum slope of ±30 degrees. The top four curves in FIG. 7 correspond to different solar azimuth angles (az) as previously shown in FIG. 1. The bottom curve shows the results for a conventional flat glass window surface without any prisms. All curves are plotted versus solar elevation angle (el) as previously shown in FIG. 1. The transmittance improvement provided by the present invention is striking. For example, for grazing rays corresponding to a solar elevation angle of about 0 degrees, the flat window would have an essentially zero transmittance of incident light into the surface for all azimuth angles. In contrast, the curvilinear prismatic film would have a transmittance from 67% to 96% depending on solar azimuth angle. The benefit of the prismatic film is maintained for all solar elevation angles up to and including 90 degrees. At 90 degrees solar elevation, the gain is from about 96% to essentially 100%.

Figure 8:
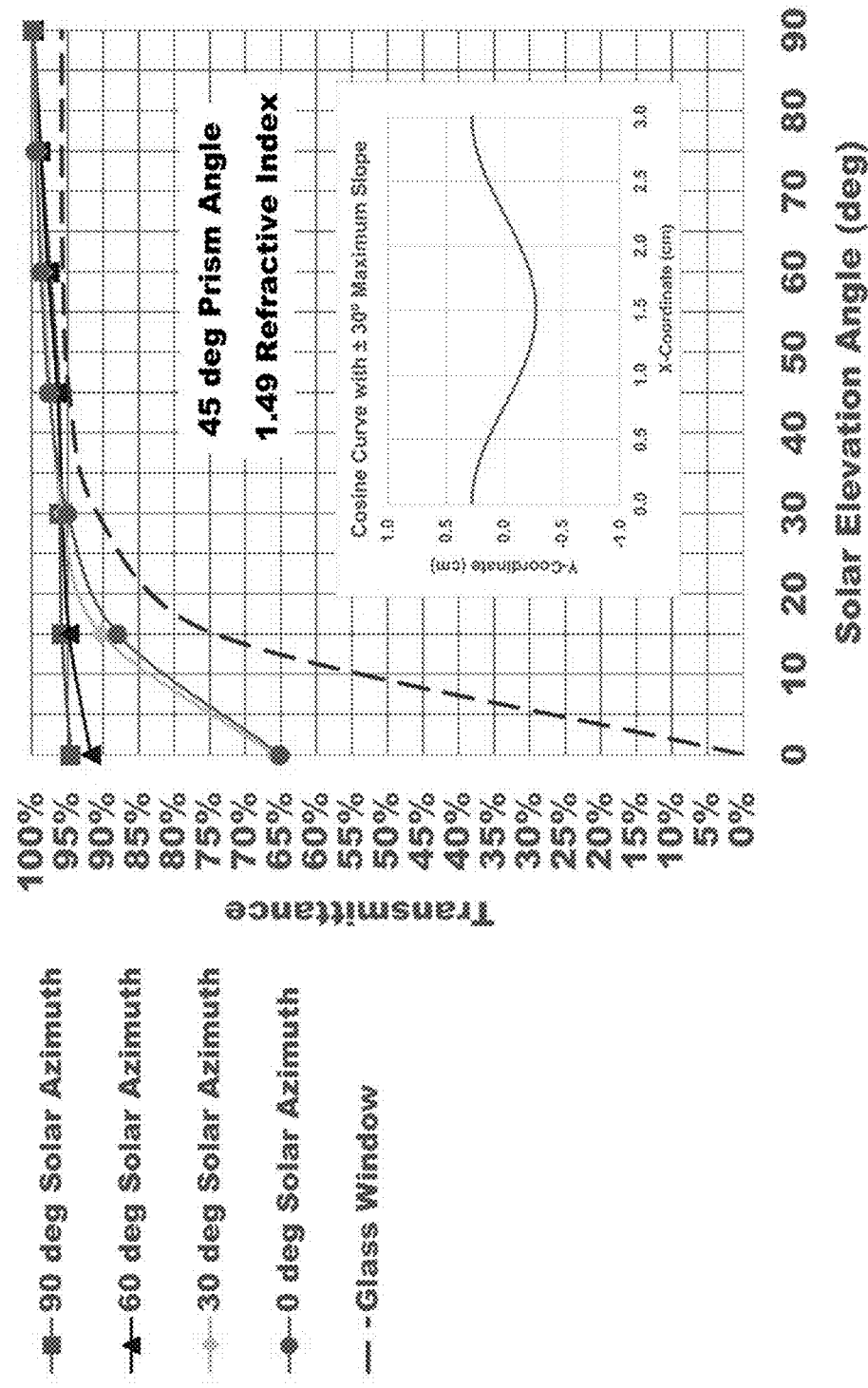

FIG. 8 shows results of a parametric ray trace analysis by the inventor for yet another version of the invention shown in FIG. 1. These results show the net transmittance into the prismatic film including the front-surface reflection capture for triangular prisms 2 with 45-degree angles for both the left and right sides of the triangle. The material is modeled with a refractive index of 1.49, which corresponds to acrylic or thermoplastic polyurethane. The curvilinear shape is shown in the inset of FIG. 8 and corresponds to a minimum/maximum slope of ±30 degrees. The top four curves in FIG. 8 correspond to different solar azimuth angles (az) as previously shown in FIG. 1. The bottom curve shows the results for a conventional flat glass window surface without any prisms. All curves are plotted versus solar elevation angle (el) as previously shown in FIG. 1. The transmittance improvement provided by the present invention is striking. For example, for grazing rays corresponding to a solar elevation angle of about 0 degrees, the flat window would have an essentially zero transmittance of incident light into the surface for all azimuth angles. In contrast, the curvilinear prismatic film would have a transmittance from 65% to 95% depending on solar azimuth angle. The benefit of the prismatic film is maintained for all solar elevation angles up to and including 90 degrees. At 90 degrees solar elevation, the gain is from about 96% to essentially 100%.

Figure 9:
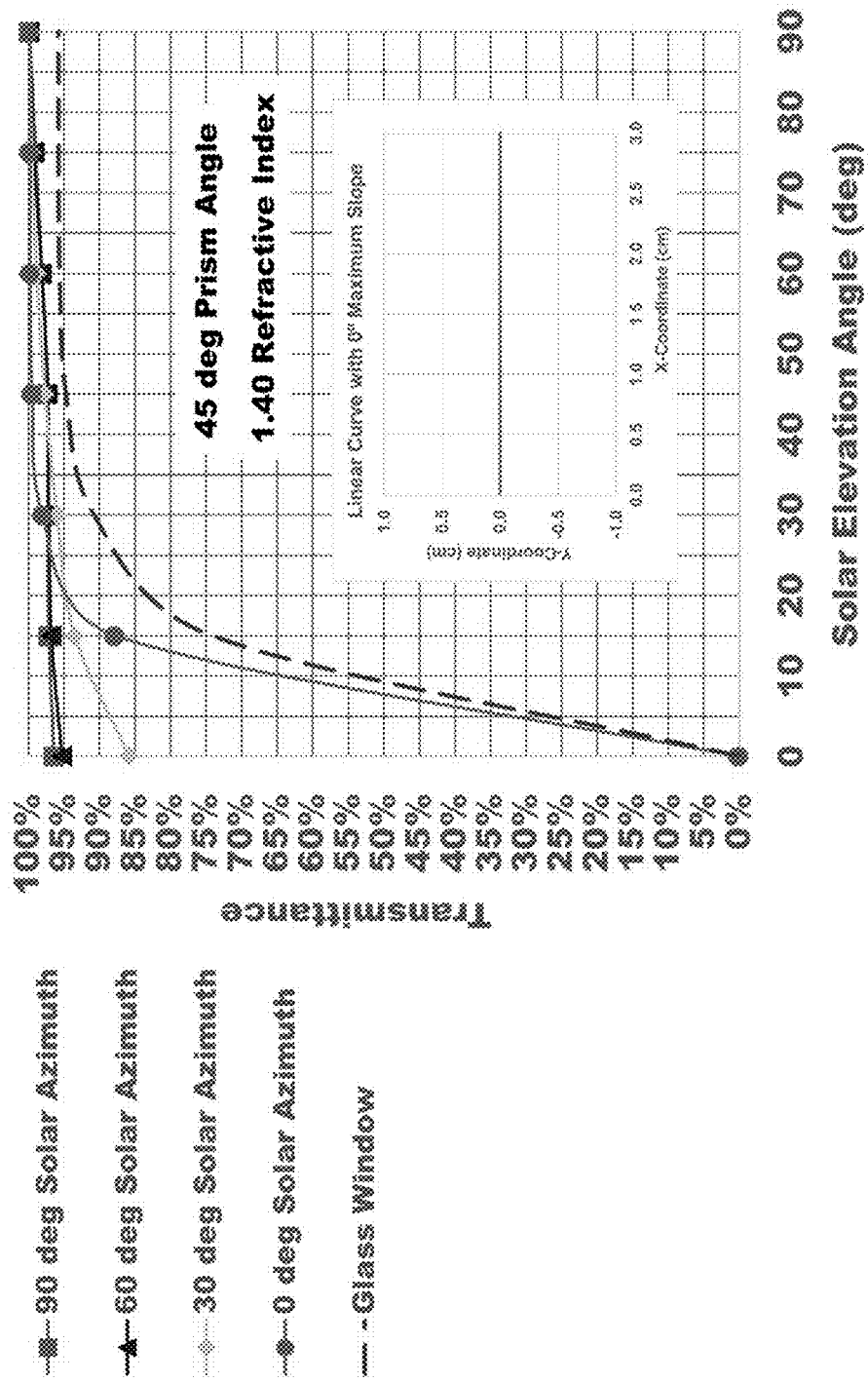

For comparison to the present invention, FIG. 9 results of a parametric ray trace analysis by the inventor for linear prisms rather than curvilinear prisms. These results show the net transmittance into the prismatic film including the front-surface reflection capture for triangular prisms 2 with 45-degree angles for both the left and right sides of the triangle. The material is modeled with a refractive index of 1.40, which corresponds to silicone or ETFE. The linear path shape is shown in the inset of FIG. 9 and corresponds to a constant slope of 0 degrees. The top four curves in FIG. 9 correspond to different solar azimuth angles (az) as previously shown in FIG. 1. The bottom curve shows the results for a conventional flat glass window surface without any prisms. All curves are plotted versus solar elevation angle (el) as previously shown in FIG. 1. The transmittance improvement provided by the linear prisms has one weak spot corresponding to combined zero values of both solar azimuth (az) and solar elevation (el). For example, for grazing rays corresponding to a solar elevation angle of about 0 degrees, the flat window would have an essentially zero transmittance of incident light into the surface for all azimuth angles. For such grazing rays (zero solar elevation angle), the linear prismatic film would also have a transmittance of 0% for a zero azimuth angle but would do much better at higher solar azimuth angles. In addition to this weak spot, the linear prisms would not provide an anti-glare surface, since the flat prismatic surfaces would all reflect in the same direction. Therefore, linear prisms are inferior to the present invention in both anti-reflection and anti-glare properties. The inventor has also explored other prismatic surface geometries including pyramids and inverted pyramids and found that these structures do not provide anti-glare properties and have other significant disadvantages compared to the present invention, including retention of dust and dirt, difficulty in cleaning, more challenging tooling, and more difficult manufacturing. In summary, the present invention provides a substantial advantage over other prismatic surfaces for both anti-reflection and anti-glare properties.

Figure 10:
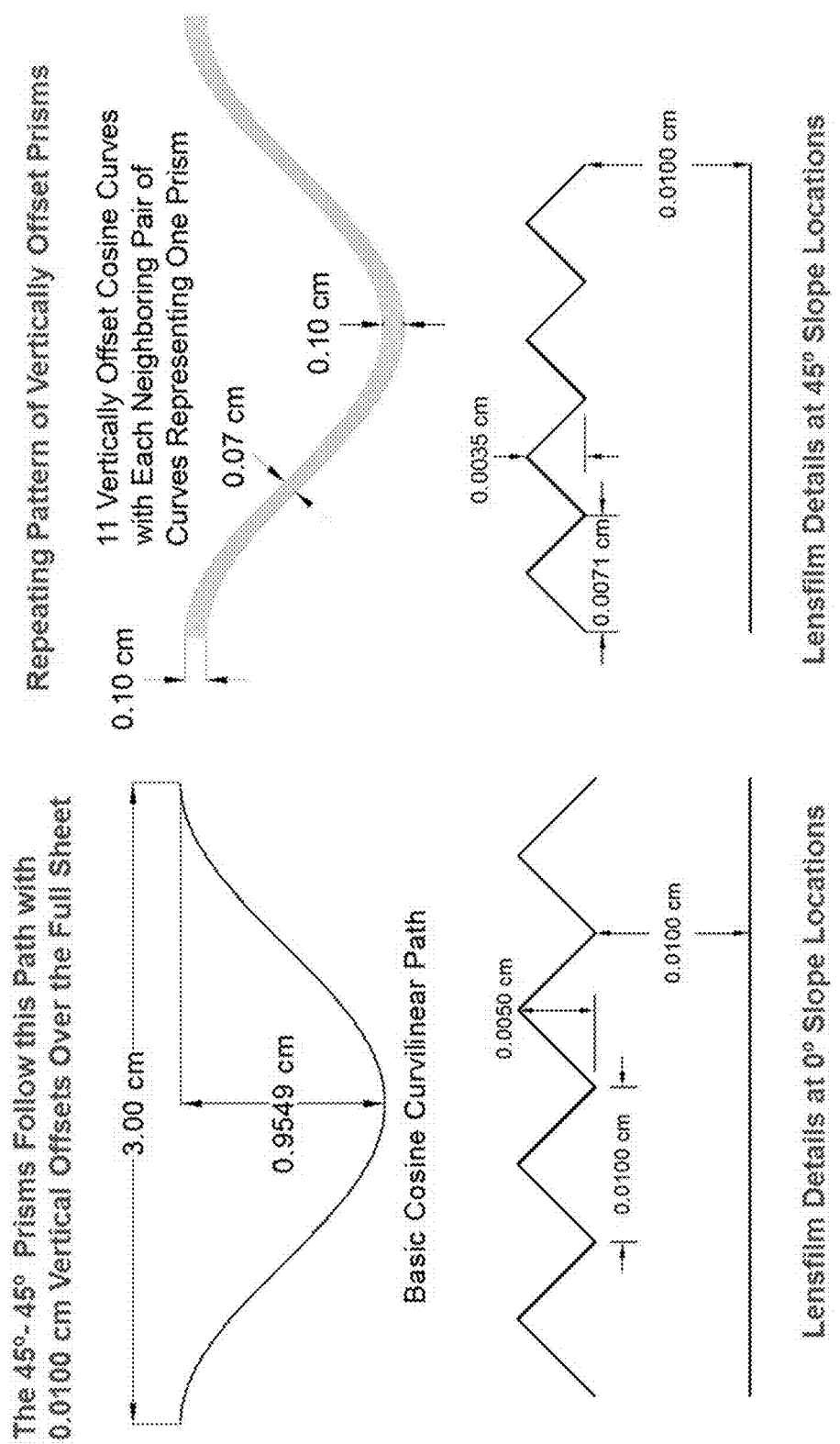

FIG. 10 shows details of the geometry of the preferred embodiment of the prismatic structure of the present invention. The prisms have a triangular cross-sectional shape with exposed prismatic surfaces tilted about 45 degrees as also previously shown in FIG. 1. The prisms are very small, about 0.0100 cm in width, to minimize material usage and to facilitate thermal embossing of the prismatic pattern in a high-speed roll-to-roll process. The prism width is not smaller because of less than perfectly sharp tip and valley radii of curvature due to manufacturing inaccuracies. The curvilinear path is a cosine with a horizontal peak-to-peak distance of about 3 cm. This small dimension is selected to be smaller than the smallest dimension of most photovoltaic cells to enable all of the curve slopes to be experienced by each photovoltaic cell in a solar panel which is covered by a large sheet of the configuration of the present invention. This small peak-to-peak dimension thereby ensures that each cell in a module or panel will have a similar current output thereby minimizing mismatch power losses when cells are combined in electrical series circuits. FIG. 10 also shows that the preferred curvilinear path has a minimum slope of −45 degrees and a maximum slope of +45 degrees, which dictates the vertical peak-to-peak distance of about 0.95 cm. Neighboring prisms follow the same curvilinear path offset vertically by the maximum prism width of about 0.0100 cm, as shown in FIG. 10. Because of the curvilinear path, the prisms vary in width from 0.0100 cm where the path slope is zero to about 0.0071 cm where the path slope is plus or minus 45 degrees, as shown in FIG. 10. The prismatic pattern is repeated continuously over large sheets of plastic, as previously shown in FIG. 1.

FIG. 11 shows photographs from recent news stories on the internet and elsewhere of serious glare problems for both ground-based systems as shown in FIG. 11-A and space-based systems as shown in FIG. 11-B. The glare from ground-based solar panel installations shown for example only in FIG. 11-A are causing significant problems as more and larger solar systems are being implemented worldwide near roadways and airports and homes. The glare from space-based constellations of satellites in low-earth orbit are causing tremendous problems for earth-based observatories. SpaceX has launched several hundred of their Starlink® satellites which will eventually number in the many tens of thousands. Other firms are also planning other constellations of thousands of low-earth orbit satellites. These Starlink® satellites are causing numerous bright streaks across the night sky spoiling observations of recent comets as shown in FIG. 11-B and many other observations of dim or distant objects in the night sky. Solar glare is a major problem which is growing each month and each year.

FIG. 12 shows conceptually how the new curvilinear prismatic film can solve the glare problems both on the Earth (FIG. 12-A) and in space (FIG. 12-B). For solar panels installed on the ground, the prismatic film can be applied to the flat outer glass or plastic window of such solar panels to eliminate the glare from these previously flat surfaces, as shown schematically in FIG. 12-A. This application can be done in the field for already installed systems or in the factory for solar panels to be later installed in the field. The application process is simple. A transparent adhesive is used to bond the flat back surface 3 of the film to the top flat surface of the solar panel. The adhesive can be selected from many different types, including pressure-sensitive adhesive (PSA) or liquid adhesive or spray-on adhesive. Such transparent adhesives are widely available in various material forms, including acrylic adhesives and silicone adhesives. For terrestrial applications, it is best to align the curvilinear prisms such that they run at least partially vertically to facilitate rainwater and wash water runoff, thereby minimizing dirt buildup in the valleys between prisms. The proper orientation of the curvilinear prisms is shown in FIG. 12-A.

FIG. 12-B shows conceptually how the curvilinear prismatic film can solve the space-based glare problem for Starlink® satellites and similar low-earth orbit spacecraft. SpaceX has stated that the glare problem is due more to the antennas on the spacecraft than to the solar arrays on the spacecraft. The new curvilinear prismatic film can be applied to these antennas as shown in FIG. 12-B. The front-surface antireflection effect of the present invention is not as important as the glare elimination for this Starlink® application. As those of ordinary skill in the art of optics well know, the circumferential spreading of reflected rays by curvilinear surfaces shown previously in FIG. 4 will also be present for rays reflected by the antenna elements in FIG. 12-B after they are refracted by the curvilinear prisms. Curvilinear surfaces cause both reflected and refracted rays to spread into a wide range of circumferential angles, thereby minimizing glare for distant observers.

The present invention can also be applied to space solar arrays to not only eliminate glare but to also improve performance by minimizing front-surface reflections using the optical effects shown previously in FIGS. 2, 3, 5, and 6.

For space applications, the curvilinear prismatic film can be protected from space environmental effects, including atomic oxygen, ultraviolet radiation, and charged particle radiation with a thin protective coating. Such coatings have been developed and proven in space for other applications, including silicone Fresnel lenses for NASA applications.

DETAILED DESCRIPTION AND BEST MODE OF IMPLEMENTATION

The present invention is a transparent curvilinear prismatic film which eliminates glare and reduces front-surface reflections for underlying solar panels and other surfaces. FIG. 1 shows in isometric view the presently preferred embodiment of the invention. The invention includes a top surface comprising many curvilinear prisms 1 each following a curved path across the top surface of the film. The prisms 2 are triangular in shape when viewed in cross section. The curvilinear prisms 1 are oriented to facilitate runoff of liquids, including rain or cleaning liquid, using gravity to enable the liquid to run downward easily in the valleys between prisms 2. The shape of the prisms 2 is triangular in cross section with typical angles for the two sides of the triangle of about 45 degrees relative to the plane of the prismatic film. The typical angles used to define the sun position relative to the prismatic film are azimuth (az) and elevation (el) as defined in FIG. 1.

The transparent prismatic film is configured to be thin, lightweight, low-cost, and easily mass-produced. The curvilinear prisms 1 with triangular cross-sectional shape 2 are shown in an enlarged manner in FIG. 1 to make them visible. In actuality, the prisms 2 will be extremely small, on the order of 100 micrometers wide by 50 micrometers tall. Such small prisms make the film very thin and minimize material content and therefore cost. The curvilinear prismatic film is configured to be easily mass-produced by a high-speed, low-cost, roll-to-roll embossing process, which uses patterned and polished rollers to impart the prismatic pattern on the top surface and a smooth, flat back surface onto thermally softened polymer. The best thermoplastic polymers for ground applications are acrylic, polycarbonate, thermoplastic polyurethane, and fluoropolymers such as ETFE and ECTFE. Many companies make these thermoplastic materials in huge quantities and sell them at commodity prices.

For space applications, the curvilinear prismatic film will be made of a transparent space-qualified material such as silicone. Dow Corning makes one such silicone known as Sylgard 93-500. Other firms make competing space-qualified silicones. To produce the curvilinear prismatic film for space applications, a two-stage process will be used. First, a high-speed, low-cost, roll-to-roll embossing process will be used to make the "negative" pattern for the desired curvilinear prismatic film. The embossed product will be made of one of the common thermoplastics such as acrylic. This embossed product will be used as a disposable molding tool to make the final silicone film to be applied to the surface of the spacecraft. The inventor has perfected this process to produce silicone Fresnel lenses for NASA and other space customers. The final silicone product can be made as a stand-alone film prior to bonding it to the spacecraft surface with a transparent adhesive, or it can be molded directly against the spacecraft surface to save the thickness and mass of a transparent adhesive.

The new curvilinear prismatic film offers two distinct benefits for both ground and space applications:
1. Significant reduction in front-surface reflections
2. Elimination of glare.

Figure 2:
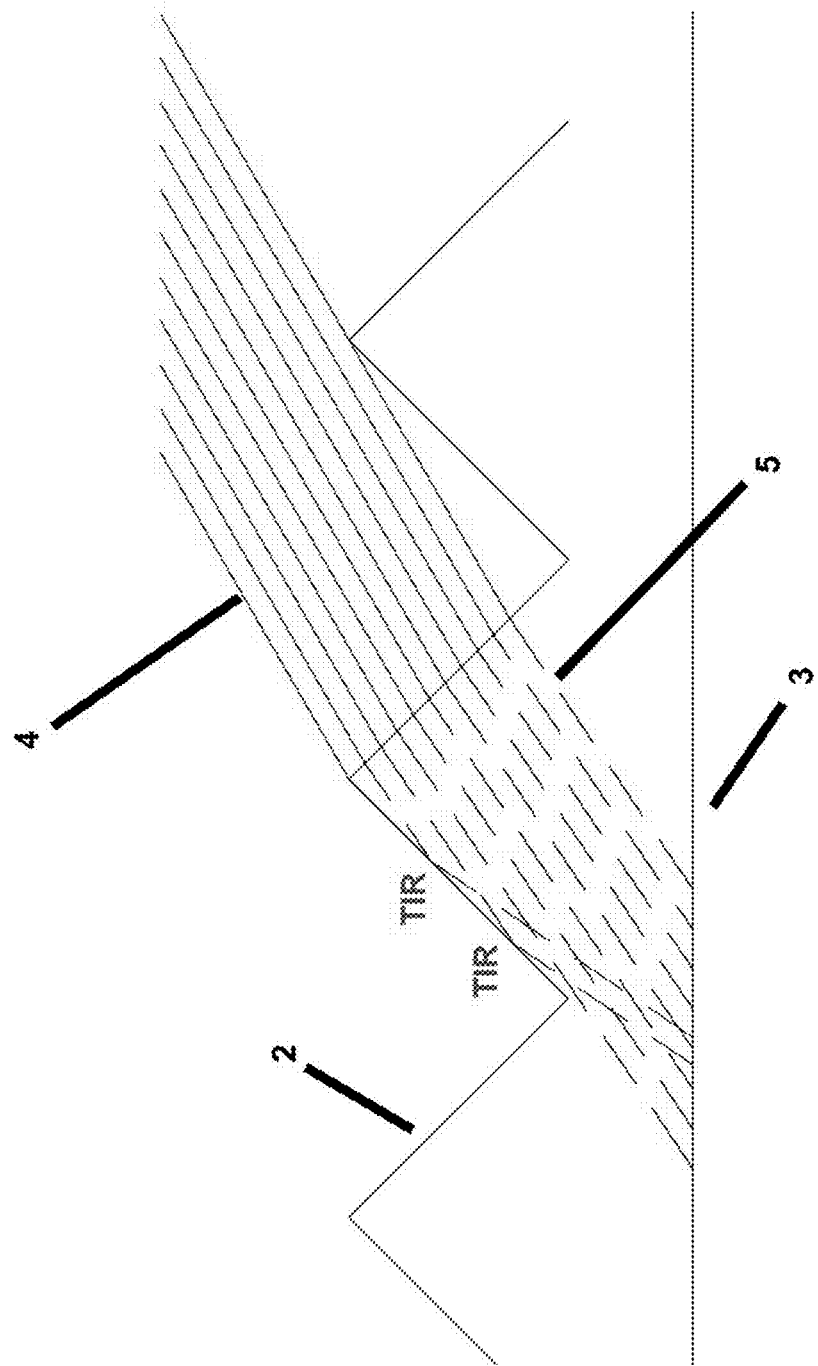
FIG. 2 shows a cross-sectional view of an example ray trace for incident sunlight 4 arriving at a large lateral angle of incidence onto the top prismatic surface of the film which contains a multitude of triangular prisms 2. After encountering the prism 2, the rays are refracted to follow a different path as shown by rays 5. Some of the refracted rays 5 proceed directly to the bottom surface 3 of the prismatic film, while others of the refracted rays 5 encounter the opposite side of the prism 2 where they are totally internally reflected (TIR) and thereafter proceed to the bottom surface 3 of the prismatic film. The relatively small angle of incidence between incident rays 4 and prism 2 minimizes reflection losses at this interface. Since all refracted rays 5 end up at the bottom surface 3 of the prismatic film, the optical efficiency in transmitting the incident rays 4 to the bottom surface 3 is extremely high. The bottom surface 3 will be bonded to the underlying solar panel or other structure with a transparent adhesive thereby allowing rays 5 to be transmitted onto such underlying panel or structure.
Figure 3:
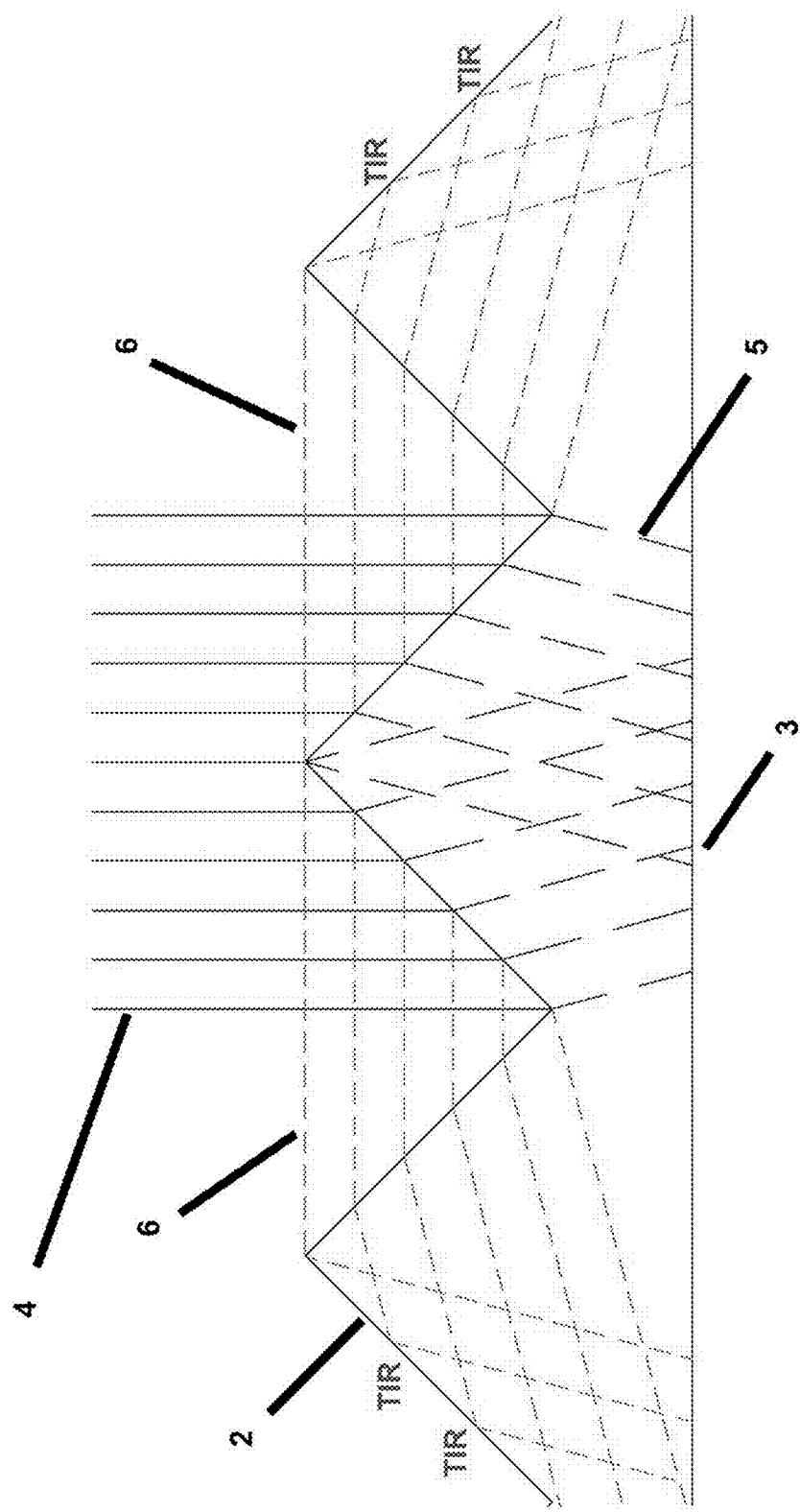
FIG. 3 shows a cross-sectional view of another example ray trace for incident sunlight 4 arriving at a small lateral angle of incidence onto the curvilinear prismatic film. After refraction by prism 2 the refracted rays 5 proceed to the bottom surface 3 of the film. A small portion of the incident rays 4 are reflected by the top surface of the prism 2 to become reflected rays 6. These front-surface reflected rays 6 are captured by the neighboring prisms 2 on either side of the center prism 2 in FIG. 3. After refraction and total internal reflection (TIR) by the neighboring prisms 2 these reflected rays 6 proceed to bottom surface 3. Since both refracted rays 5 and first-surface reflected rays 6 eventually proceed to bottom surface 3, the optical efficiency of collection is extremely high due to presence of the prisms 2. The bottom surface 3 will be bonded to the underlying solar panel or other structure with a transparent adhesive thereby allowing rays 5 and 6 to be transmitted onto such underlying panel or structure.

FIGS. 2 and 3 show in cross-sectional view how the prisms 2 minimize front-surface reflections for incident rays 4 at both high lateral incidence angles and small lateral incidence angles, respectively. For high lateral incidence angles, the prisms 2 present a more normal surface to the incident rays 4 than a non-prismatic surface would experience. This minimizes front-surface reflection losses which are known by those of ordinary skill in the art of optics to be much lower for more normal incidence angles than for more grazing incidence angles. The incident rays 4 are refracted by the surface of the prism 2 to become refracted rays 5. Some of rays 5 go directly to the bottom surface 3 of the film, while others are first totally internally reflected (TIR) by the opposing side of prism 2 before proceeding to bottom surface 3. The overall optical effect of the prisms 2 is to deliver the incident rays 4 very efficiently to the back surface 3 of the curvilinear prismatic film.

Similarly, for incident rays 4 arriving at the prismatic surface with small incidence angles, FIG. 3 shows that these rays 4 are also delivered very efficiently to back surface 3 by a number of different phenomena. Some of the rays 5 enter the prismatic film and are refracted before proceeding to the back surface 3. Others of the rays 6 are reflected by the front surface of the prism 2 and proceed to the adjacent neighboring prisms 2. At the neighboring prisms 2, these front-surface reflected rays 6 enter the neighboring prisms 2 and proceed to the back surface 3 after refraction and in some cases total internal reflection (TIR) from the opposite side of the neighboring prisms 2. The overall optical effect of the prisms 2 is to deliver the incident rays 4 very efficiently to the back surface 3 of the curvilinear prismatic film.

Figure 4:
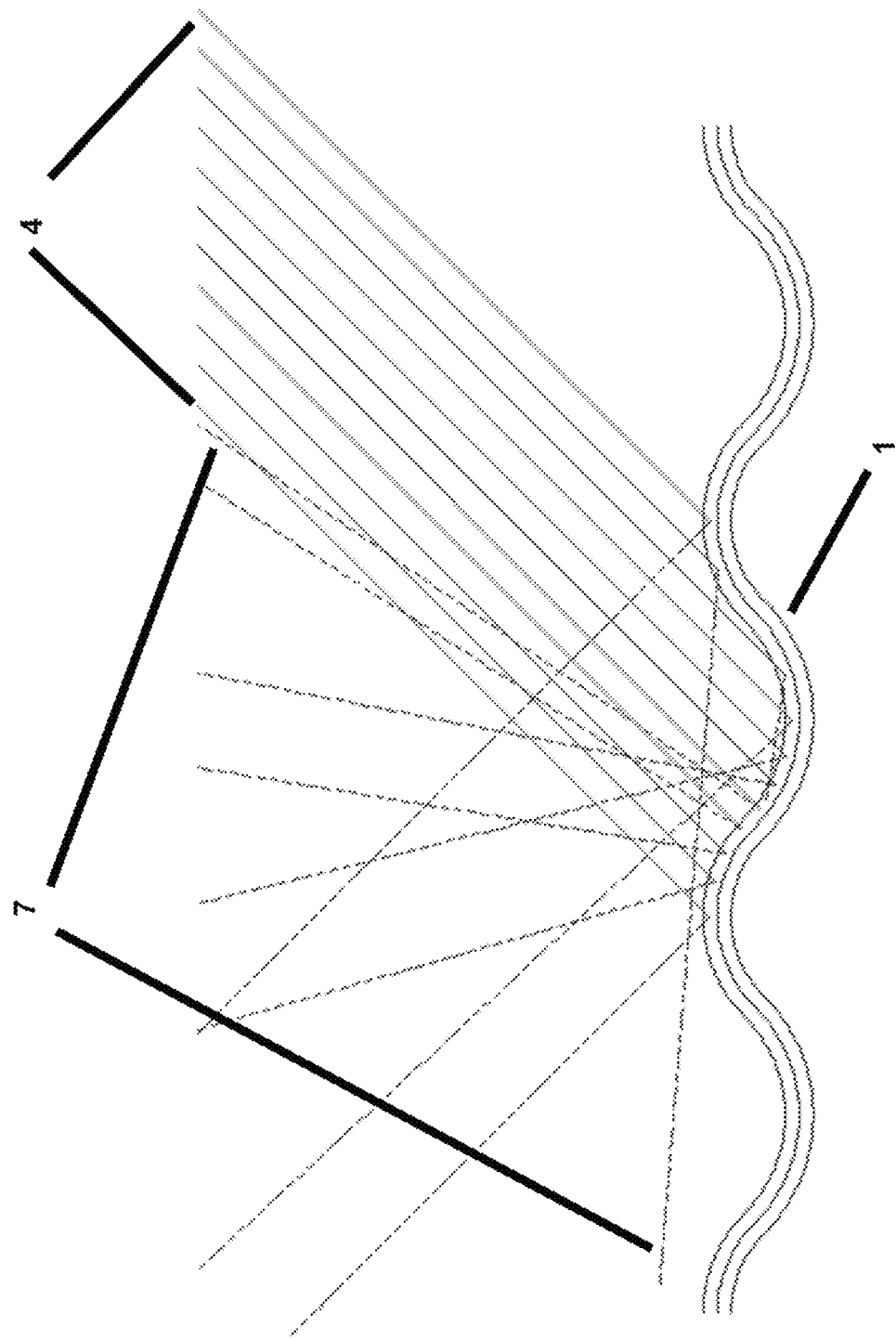
FIG. 4 is a top view of one of the curvilinear prisms 1 showing a ray trace of incident rays 4 and first-surface reflected rays 7 which avoid capture by the surrounding prisms. Such rays 7 could correspond to first-surface reflected rays for high lateral incidence angles for incident rays 4 such as shown in FIG. 2. Due to the curvilinear shape of the surfaces, such first-surface reflected rays 7 are scattered in many circumferential directions, thereby eliminating glare that would be present if the surfaces were instead flat. It is well known by those of ordinary skill in the art of optics that curved surfaces cause such scattering of incident light and elimination of glare for observers at significant distances from the curved reflective surfaces.

The avoidance of glare from the new curvilinear prismatic film is due to the curvature of the prisms 1 as they run across the top surface of the film, as shown in a top view of the film in FIG. 4. For large lateral incidence angles of sunlight onto the curvilinear prismatic film, some rays will be reflected by the front surface of the prisms beyond the neighboring prisms 2. For such a situation, incident rays 4 are approximately parallel to each other until they encounter the curved surface of the curvilinear prism 1. Front-surface reflected rays 7 then depart in a wide variety of circumferential angles which eliminates glare for a distant observer.

FIGS. 5 and 6 quantify the remarkable improvement in net transmittance of incident rays 4 into the curvilinear prismatic film compared to conventional flat surfaces made of the same transparent material. The curvilinear path assumed for the prisms in FIGS. 5 and 6 is a cosine curve with a minimum slope of −45 degrees and a maximum slope of +45 degrees. The difference between FIG. 5 and FIG. 6 is the assumed refractive index of the polymer, namely 1.40 for FIG. 5 and 1.49 for FIG. 6. The lower index corresponds to materials like silicone and ETFE. The higher index corresponds to materials like acrylic and thermoplastic polyurethane. Regardless of the value of the refractive index of the polymer, the improvement in net transmittance of incident rays 4 into the polymer and onto the bottom surface 3 is remarkable, for all solar azimuth and solar elevation angles. When the smooth bottom surface 3 of the new curvilinear prismatic film is bonded to a solar panel with a transparent adhesive, the solar panel performance will correspondingly improve with the increase in net transmittance. The solar panel will therefore produce more usable energy output and provide greater value to the owner.

FIGS. 7 and 8 show the results of further analysis by the inventor for alternate curvilinear curve shapes corresponding to a cosine curve with a minimum slope of −30 degrees and a maximum slope of +30 degrees. These results for two assumed values of refractive index, namely 1.40 for FIG. 7 and 1.49 for FIG. 8. The gain in performance compared to a conventional cover glass is substantial for all solar azimuth and elevation angles, but is not quite as high as for the slightly larger slope cosine paths corresponding to FIGS. 5 and 6. The presently preferred path is therefore the path corresponding to FIGS. 5 and 6. Still larger slope cosine paths could be chosen but drainage of liquid might be impeded. Liquids may be used to clean space prismatic windows prior to launch, and such liquids need to easily drain. Rain needs to easily drain from ground-based prismatic windows.

For comparison to the present invention, FIG. 9 shows similar results for linear prisms. Linear prisms suffer from a weak spot when both solar elevation and solar azimuth angles approach zero. At this condition, the transmittance into the prismatic structure is zero, just the same as for a conventional glass window, as shown in FIG. 9. Similarly, linear prisms do not eliminate glare. The present invention therefore provides substantial benefits over linear prisms and other prismatic structures.

FIG. 10 provides geometrical details of one preferred embodiment of the present invention. The prisms are small and have an included angle of 90 degrees at each apex. The repeating curvilinear path is a cosine curve with minimum and maximum slopes of −45 and +45 degrees, respectively. The prismatic paths are offset vertically by the maximum width of each prism. The prism width varies continuously over the cosine path from a maximum value of about 0.0100 cm where the slope is zero to about 0.0071 cm where the slope is a minimum of maximum value. The base thickness is shown as 0.0100 cm, but this is just a typical value which can vary widely depending on the material and application.

Perhaps more important than the reduced front-surface reflections provided by the new curvilinear prismatic film is the minimization of glare provided by the invention. FIG. 11 shows photographs of severe glare problems caused by ground-based solar panels (FIG. 11-A) and by space-based surfaces of low earth orbit (LEO) spacecraft (FIG. 11-B). The new curvilinear prismatic film can solve both of these problems in a simple, low-cost, low-mass manner. The preferred embodiments of ways to apply the invention to both ground-based and space-based surfaces to minimize glare is shown in FIG. 12. For ground-based solar panels, which typically have a glass or plastic front window surface, the glare can be severe for certain times of day and days of the year. The curvilinear prismatic film can be applied as shown schematically in FIG. 12-A to solve this glare problem. The film is attached to the glass or plastic window surface using a transparent adhesive to bond the back surface of the film 3 to the window. The transparent adhesive can be selected from a pressure sensitive adhesive (PSA), a liquid adhesive, or a spray-on adhesive. To promote adhesion, the window surface and the film surface can be treated with primers or other surface treatments.

For space-based applications, the curvilinear prismatic film can be applied to spacecraft surfaces that would otherwise be plagued with glare, as shown in FIG. 12-B. For space applications, the curvilinear prismatic film will need to be made of a space-qualified material like silicone, such as Dow Corning Sylgard 93-500. One preferred embodiment method of applying such a silicone film to a spacecraft surface is to mold it in place in the factory where the spacecraft is manufactured. The disposable molding tools can be made by the low-cost, high-speed, roll-to-roll embossing process using a thermoplastic material such as acrylic. This method results in the thinnest and lowest mass curvilinear prismatic film for the spacecraft surface to be protected from glare. An alternate method is to make the silicone curvilinear prismatic film as a stand-alone product and apply it to the spacecraft surface with a transparent adhesive, as shown in FIG. 12-B. The transparent adhesive can be the same silicone material used to make the film, and the surfaces to be bonded together may be treated with primer to promote aggressive adhesion.

The discussion and description of preferred embodiments in previous paragraphs is meant to be exemplary but not exclusionary. Those of ordinary skill in the art of optics will recognize that may other prismatic geometries, dimensions, materials, and methods of manufacture can be used to accomplish the basic improvements in reflection reduction and glare elimination by using the fundamental new approach of curvilinear prismatic films disclosed for the present invention. All of these variations fall within the scope and spirit of the present invention.

I claim:

1. A transparent curvilinear prismatic film for minimizing first surface reflection losses and for mitigating reflected glare with a top surface directly exposed to incident sunlight and other incident ambient light and a bondable bottom surface wherein:
    a) said top surface comprises a multitude of prisms which are substantially triangular in cross section,
    b) said multitude of prisms follow curvilinear paths across said top exposed surface, wherein said curvilinear paths deviate from straight line paths by at least 10 degrees,
    c) said bottom surface comprises a substantially flat, bondable surface enabling attachment to an underlying surface with a transparent adhesive.

2. The transparent curvilinear prismatic film of claim 1 wherein said multitude of prisms are each configured with both exposed faces tilted relative to said bottom surface by 35-55 degrees.

3. The transparent curvilinear prismatic film of claim 1 wherein said multitude of prisms are each configured with a maximum width of less than 250 micrometers.

4. The transparent curvilinear prismatic film of claim 1 wherein the curvilinear paths of said multitude of prisms comprise curves which have slopes which vary continuously along the length of the path from zero to a maximum positive angle back to zero to a minimum negative angle back to zero and so on in a repeating pattern.

5. The transparent curvilinear prismatic film of claim 4 wherein said maximum angle is larger than +15 degrees and wherein said minimum angle is smaller than −15 degrees.

6. The transparent curvilinear prismatic film of claim 4 wherein the lengthwise distance between repeating maximum values is less than 15 cm.

7. The transparent curvilinear prismatic film of claim 1 wherein said film is made of a thermoplastic polymer.

8. The transparent curvilinear prismatic film of claim 7 wherein said film is made by a thermal embossing process.

9. The transparent curvilinear prismatic film of claim 1 wherein said film is made of a silicone.

10. The transparent curvilinear prismatic film of claim 9 wherein said film is made by a cast and cure process.

11. A transparent window for a solar panel for minimizing first surface reflection losses and for mitigating reflected glare, said window having a top surface directly exposed to incident sunlight and to other incident ambient light and a bottom surface suitable for bonding to said underlying solar panel wherein:
    a) said top surface comprises a multitude of prisms which are substantially triangular in cross section,
    b) said multitude of prisms follow curvilinear paths across said top surface, wherein said curvilinear paths deviate from straight line paths by at least 10 degrees,
    c) said bottom surface comprises a substantially flat, bondable surface bonded to said underlying solar panel with a transparent adhesive.

12. The transparent window of claim 11 wherein said multitude of prisms are each configured with two faces tilted relative to said back surface by 35-55 degrees.

13. The transparent window of claim 11 wherein said multitude of prisms are each configured with a maximum width of less than 250 micrometers.

14. The transparent window of claim 11 wherein the curvilinear paths of said multitude of prisms comprise curves which have slopes which vary continuously along the length of the path from zero to a maximum positive angle back to zero to a minimum negative angle back to zero and so on in a repeating pattern.

15. The transparent window of claim 14 wherein said maximum angle is larger than +15 degrees and wherein said minimum angle is smaller than −15 degrees.

16. The transparent window of claim 11 wherein the lengthwise distance between repeating maximum values is less than 15 cm.

17. The transparent window of claim 11 wherein said window is made of a thermoplastic polymer.

18. The transparent window of claim 17 wherein said window is made by a thermal embossing process.

19. The transparent window of claim 11 wherein said window is made of a silicone.

20. The transparent window of claim 19 wherein said window is made by a cast and cure process.

* * * * *